US007017130B2

(12) United States Patent
Lee et al.

(10) Patent No.: US 7,017,130 B2
(45) Date of Patent: Mar. 21, 2006

(54) METHOD OF VERIFICATION OF ESTIMATING CROSSTALK NOISE IN COUPLED RLC INTERCONNECTS WITH DISTRIBUTED LINE IN NANOMETER INTEGRATED CIRCUITS

(75) Inventors: Herng-Jer Lee, Tao-Yuan (TW); Chia-Chi Chu, Tao-Yuan (TW); Wu-Shiung Feng, Tao-Yuan (TW); Ming-Hong Lai, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 35 days.

(21) Appl. No.: 10/889,497

(22) Filed: Jul. 12, 2004

(65) Prior Publication Data

US 2006/0010406 A1    Jan. 12, 2006

(51) Int. Cl.
G06F 17/50    (2006.01)
G06F 9/45    (2006.01)
(52) U.S. Cl. .................. 716/5; 716/1; 716/2; 716/6
(58) Field of Classification Search .............. 716/1, 716/2, 5, 6
See application file for complete search history.

(56) References Cited

U.S. PATENT DOCUMENTS

| 5,481,695 | A |   | 1/1996 | Purks .................... 395/500 |
| 5,535,133 | A |   | 7/1996 | Petschauer et al. ......... 364/489 |
| 5,555,506 | A |   | 9/1996 | Petschauer et al. ......... 364/491 |
| 5,568,395 | A |   | 10/1996 | Huang .................... 364/489 |
| 5,596,506 | A |   | 1/1997 | Petschauer et al. ......... 364/491 |
| 6,018,623 | A |   | 1/2000 | Chang et al. .......... 395/500.07 |
| 6,029,117 | A |   | 2/2000 | Devgan .................... 702/58 |
| 6,405,348 | B1 |   | 6/2002 | Fallah-Tehrani et al. ...... 716/4 |
| 6,434,729 | B1 | * | 8/2002 | Alpert et al. ............... 716/6 |
| 6,732,065 | B1 | * | 5/2004 | Muddu .................... 703/2 |
| 2003/0115563 | A1 | * | 6/2003 | Chen ....................... 716/5 |
| 2003/0237070 | A1 | * | 12/2003 | Tomita et al. ............. 716/12 |
| 2005/0060674 | A1 | * | 3/2005 | Roethig ................... 716/5 |
| 2005/0060675 | A1 | * | 3/2005 | Tetelbaum ................ 716/5 |

OTHER PUBLICATIONS

Lee, H-J et al., "Crosstalk Estimation in High-Speed VLSI Interconnect using Coupled RLC—Tree Models", APCCAS '02, 2002 Asia-Pacific Conference on Circuits and Systems, vol. 1, Oct. 28-31, 2002, pp. 257-262.*

Lee, H-J et al., "Moment Computations of Nonuniform Distributed Coupled RLC trees with Estimating Crosstalk Noise", Proceedings, 5th International Symposium on Quality Electronic Design, 2004, pp. 75-80.*

(Continued)

*Primary Examiner*—Stacy A. Whitmore
*Assistant Examiner*—Magid Y. Dimyan
(74) *Attorney, Agent, or Firm*—Alan D. Kamrath; Nikolai & Mersereau, P.A.

(57) ABSTRACT

A method and verification of estimating crosstalk noise in coupled RLC interconnects with distributed line in nanometer integrated circuits is provided. In this invention, nanometer VLSI interconnects are modeled as distributed RLC coupled trees. The efficiency and the accuracy of moment computation of distributed lines can be shown that outperform those of lumped ones. The inductive crosstalk noise waveform can be accurately estimated in an efficient manner using the linear time moment computation technique in conjunction with the projection-based order reduction method. Recursive formulas of moment computations for coupled RC trees are derived with considering both self inductances and mutual inductances. Also, analytical formulas of voltage moments at each node will be derived explicitly. These formulas can be efficiently implemented for crosstalk estimations.

2 Claims, 5 Drawing Sheets

OTHER PUBLICATIONS

Davis, J.A et al. "Compact Distributed RLC Models for Multilevel Interconnect Networks" 1999 Digest of Technical Papers, Syposium on VLSI circuits, Jun. 17-19, 1999, pp. 167-168.*

Cao. Y, et al, "A New Analytical Delay and Noise Model for On-Chip RLC Interconnect" International Electron Devices Meeting, IEDM Technical Digest, Dec. 10-13, 2000, pp. 823-826.*

* cited by examiner

METHOD OF VERIFICATION OF ESTIMATING CROSSTALK NOISE IN COUPLED RLC INTERCONNECTS WITH DISTRIBUTED LINE IN NANOMETER INTEGRATED CIRCUITS

BACKGROUND OF THE INVENTION

1. Field of the Invention

The present invention relates to a method of estimating crosstalk noise in high-speed VLSI interconnects, and more particularly to a method of using moment computations of coupled RLC-tree models with uniform distributed lines and project-based model-order reduction techniques.

2. Description of Related Art

Modern technological trends have caused interconnect modeling to have attracted considerable attention in high-speed VLSI designs. Owing to these designs with performance considerations, increasing clock frequency, shorter rising times, higher density of wires, and using low-resistivity materials, on-chip inductance effects can no longer be ignored in interconnect models. Furthermore, the importance of coupling inductance effects has grown continuously since nanometer technology has emerged over the last few years. It has been observed that crosstalk noise estimations made by considering inductance effects may yield more pessimistic results than those made without considering coupling inductance effects, as discussed in C. K. Cheng, J. Lillis, S. Lin, and N. H. Chang, Interconnect Analysis and Synthesis, John Wiley and Sons Inc., 2000. Such estimation errors follow from two main reasons: (1) more and longer wires in parallel increase the capacitive coupling, leading to large current changes on the victim nets. (2) increasing self inductance worsens overshooting spikes on aggressor nets. It may then pull the victims with them. For the above practical considerations, interconnect models shall be extended to be coupled RLC trees while considering the inductance effects.

A common means of estimating crosstalk noise is implemented by simulating circuit-level VLSI interconnects. Although the results are very accurate, the computational complexity is excessive, especially for large-scale interconnect simulations. An alternative approach, called model-order reduction methods, has recently emerged to solve the problem, as disclosed in L. T. Pillage and R. A. Rohrer, "Asymptotic waveform evaluation for timing analysis," IEEE Trans. Computer-Aided Design, vol. 9, no. 4, pp. 352–366, 1990; P. Feldmann and R. W. Freund, "Efficient linear circuit analysis by Pade approximation via the Lanczos process," IEEE Trans. Computer-Aided Design, vol. 14, no. 5, 1995, and A. Odabasioglu, M. Celik, and L. T. Pileggi, "PRIMA: passive reduced-order interconnect macromodeling algorithm," IEEE Trans. Computer-Aided Design, vol. 17, no. 8, pp. 645–653, 1998. Then, rather than directly estimating the crosstalk waveform of the original interconnects, the crosstalk noise of the reduced-order system is estimated. However, the computational cost is still too high for a noise optimization problem even though model-order reduction methods have reduced the cost, as disclosed in A. Devgan, "Efficient coupled noise estimatin for on-chip interconnects," in Porc. ICCAD, 1997, pp. 147–151; M. Kuhlmann and S. S. Sapatnekar, "Exact and efficient crosstalk estimation," IEEE Trans. Computer-Aided Design, vol. 20, no. 7, pp. 858–866, 2001.

A consensus has emerged that of many model-order reduction techniques, the moment matching approach seems to be the most viable for estimating interconnect crosstalk noise. For computational efficiency, traditional models for estimating noise in coupled RC trees have been developed, including the one-pole model (1P) (as disclosed in A. Vittal, L. H. Chen, M. Marek-Sadowska, K. P. Wang, and S. Yang, "Crosstalk in VLSI interconnects," IEEE Trans. Computer-Aided Design, vol. 18, pp. 1817–1824, 1999; and A. Vittal and M. Marek-Sadowska, "Crosstalk reduction for VLSI," IEEE Trans. Computer-Aided Design, vol. 16, pp. 290–298, 1997), the modified one-pole model (M1P) (as disclosed in Q. Yu and E. S. Kuh, "Moment computation of lumped and distributed coupled RC trees with application to delay and crosstalk estimation," Proceedings of the IEEE, vol. 89, no. 5, pp. 772–788, 2001), the two-pole model (2P) (as discussed in M. Kuhlmann and S. S. Sapatnekar, "Exact and efficient crosstalk estimation," IEEE Trans. Computer-Aided Design, vol. 20, no. 7, pp. 858–866, 2001.; and Q. Yu and E. S. Kuh, "Moment computation of lumped and distributed coupled RC trees with application to delay and crosstalk estimation," Proceedings of the IEEE, vol. 89, no. 5, pp. 772–788, 2001), (as disclosed in E. Acar, A. Odabasioglu, M. Celik, and L. T. Pileggi, "S2P: A stable 2-pole RC delay and coupling noise metric," in Proc. 9th Great Lakes Symp. VLSI, March 1999, pp. 60–63), and the guaranteed stable three-pole model (S3P) (as discussed in Q. Yu and E. S. Kuh, "Moment computation of lumped and distributed coupled RC trees with application to delay and crosstalk estimation," Proceedings of the IEEE, vol. 89, no. 5, pp. 772–788, 2001). Unlike the general model-order reduction methods, the techniques simply estimate the peak value of crosstalk noise and the time at which it peaks rather than evaluating the waveform of crosstalk noise. Also, other patents U.S. Pat. No. 5,481,695, U.S. Pat. No. 5,535,133, U.S. Pat. No. 5,555,506, U.S. Pat. No. 5,568,395, U.S. Pat. No. 5,596,506, U.S. Pat. No. 6,018,623, U.S. Pat. No. 6,029,117, and U.S. Pat. No. 6,405,348 have been disclosed the techniques about the crosstalk noise estimations. However, since the interconnect crosstalk noise may have a non-monotonic response waveform, these models seem to be unsuitable for capturing the essential nature of such crosstalk noise.

Recently, the delay and noise formulae by considering self inductances and mutual inductances have been disclosed in Y Cao, X. Huang, D. Sylvester, N. Chang, and C. Hu, "A new analytical delay and noise model for on-chip RLC interconnect," in Proc. IEDM 2000, 2000, pp. 823–826. However, their model is restricted to two parallel lines. The analytical delay and overshooting formulae for coupled RLC lines have been disclosed in M. H. Chowdhury, Y. I. Ismail, C. V. Kashyap, and B. L. Krauter, "Performance analysis of deep sub micron VLSI circuits in the presence of self and mutual inductance," in Proc. ISCAS 2002, 2002, pp. 197–200. However, issues concerning inductive crosstalk noise analysis have still not yet been studied. Furthermore, by exploring the special nature of RLC-tree structures, recursive algorithms for computing system moments with linear order have been developed, for example, by C. L. Ratzlaff and L. T. Pillage, "RICE: rapid interconnect circuit evaluation using AWE," IEEE Trans. Computer-Aided Design, vol. 13, no. 6, pp. 763–776, 1994 and Q. Yu and E. S. Kuh, "Exact moment matching model of transmission lines and application to interconnect delay estimation," IEEE Trans. VLSI syst., vol. 3, no. 2, pp. 311–322, 1995, independently. Moment models of general transmission lines were presented in Q. Yu, E. S. Kuh, and T. Xue, "Moment models of general transmission lines with application to interconnect analysis and optimization," IEEE Trans. VLSI syst., vol. 4, no. 4, pp. 477–494, 1996. However, these studies did not mention moment computations for coupled RLC trees.

The technique, "Crosstalk estimated in high-speed VLSI interconnect using coupled RLC-tree models", which is proposed in Proc. 2002 IEEE Asia Pacific Conference on Circuits and Systems, is our initial research. Although the moment computation formulae for coupled RLC trees have been developed, the technique about efficiently constructing the crosstalk estimation model was not provided. Also, the stability of the model was still not analyzed. In addition, the line model is represented as sections of lumped RLC circuits. In order to increase accuracy of the estimation results, the number of the sections must be increase. However, this will increase the memory space for storing data and simulation time.

SUMMARY OF THE INVENTION

The present invention discloses a method for efficiently estimating crosstalk noise of high-speed VLSI interconnects. In the invention, high-speed VLSI interconnects are modeled as RLC coupled trees with uniform distributed lines. The inductive crosstalk noise waveform can be accurately estimated in an efficient manner using the linear time recursive moment computation technique in conjunction with the projection-based order reduction method. Every moment of a line is represented as a polynomial of the coordinate of the line. Although a distributed line is a infinite order system in nature, the order of each moment polynomial can be shown finite. Notably, all of the coefficients of the polynomials of moments can be calculated recursively. Recursive moment computation formulas and a moment model for distributed coupling RLC-tree models are also developed. The efficiency and the accuracy of moment computation of distributed lines can be shown that outperform those of lumped ones. Crosstalk-metric models for distributed coupled RLC trees are also established. A stable reduced-order model will be constructed implicitly using the recursive moment computation technique in conjunction with the projection-based model-order reduction method.

Crosstalk noise estimations will be made by investigating the crosstalk noise of this reduced-order network.

Further benefits and advantages of the present invention will become apparent after a careful reading of the detailed description with appropriate reference to the accompanying drawings.

DETAILED DESCRIPTION OF THE INVENTION

Figure 1:
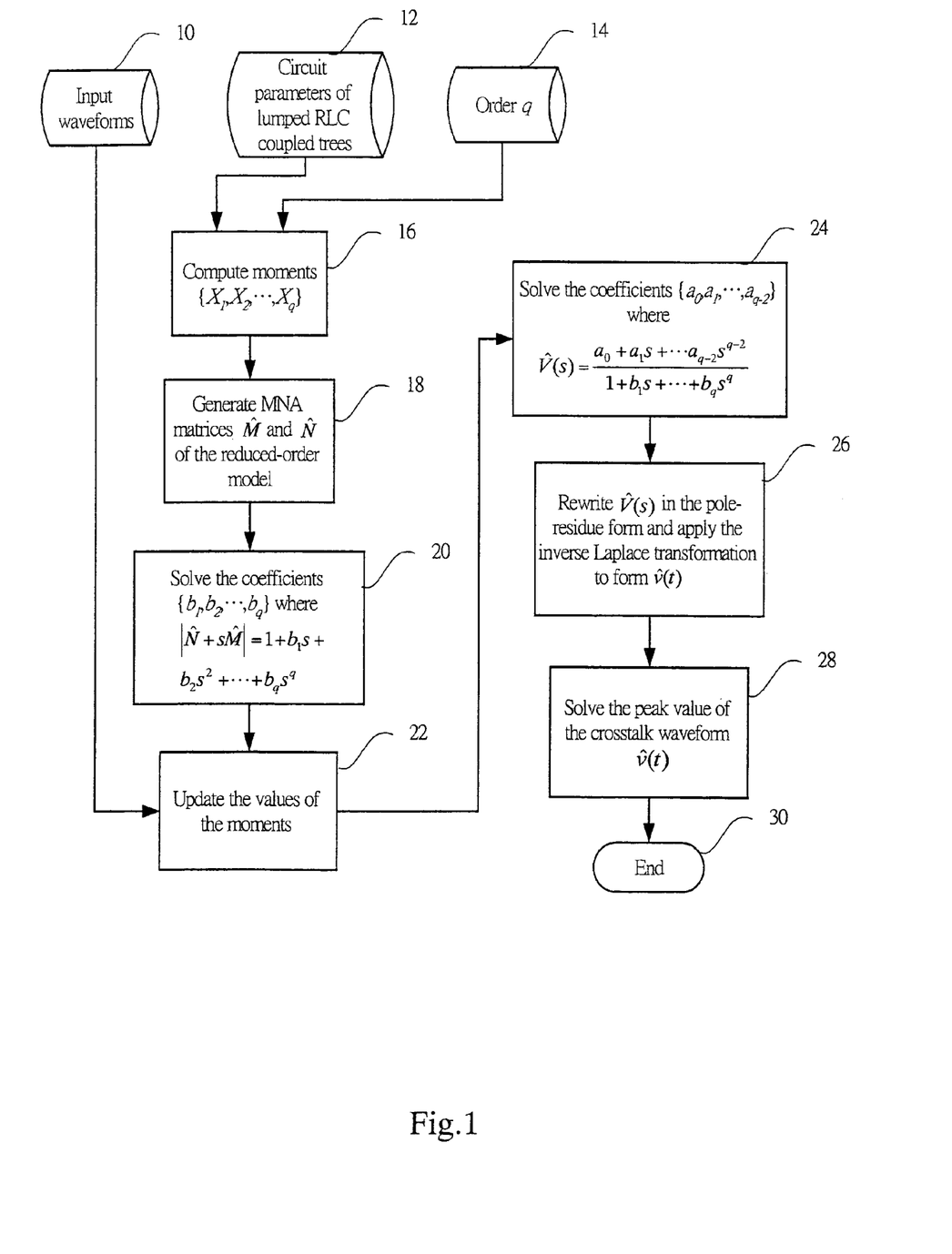
FIG. 1 represents a flow chart of the method of estimating crosstalk noise in RLC coupled interconnects in accordance with the present invention.

FIG. 1 shows the flow chart of the crosstalk estimation algorithm in the disclosed invention. Three input files should be included, which contain input signal 10, circuit parameters of the lumped coupled RLC trees 12, and the order q of the reduced-order model 14. Initially, in step 16, calculate q-order moments $\{X_1, X_2, \ldots X_q\}$. Then, in step 18, construct q-order reduced-order MNA matrices $\hat{M}$ and $\hat{N}$. In step 20, calculate the coefficients $\{b_1, b_2, \ldots, b_q\}$ of the equation $|\hat{N}+s\hat{M}|=1+b_1s+b_2s^2+\ldots+b_qs^q$. Step 22 updates the values of the moments according to the input signal. Step 24 calculates the coefficients $\{a_0, a_1, \ldots, a_{q-2}\}$ of the transfer function of the qth-order reduced-order model $$\hat{V}(s) = \frac{a_0 + a_1 s + \ldots + a_{q-2}s^{q-1}}{1 + b_1 s + \ldots + b_{q-1}s^{q-1} + b_q s^q}$$

by using the moments obtained in step 22. Then $\hat{V}(s)$ is reformulated by the pole-residue form $$\hat{V}(s) = \frac{k_1}{s-p_1} + \frac{k_2}{s-p_2} + \ldots + \frac{k_q}{s-p_q}$$

and the resultant time-domain crosstalk noise will be $\hat{v}(t) = k_1 e^{p_1 t} + k_2 e^{p_2 t} + \ldots + k_q e^{p_q t}$ by applying the inverse Laplace transform in step 26. Finally, step 28 estimates the peak value the crosstalk noise and the algorithm is terminated in step 30.

The dynamics of RLC coupled trees can also be represented by the following MNA formula:

$$\left( s \underbrace{\begin{bmatrix} \hat{M}_d & 0 & 0 \\ 0 & C & 0 \\ 0 & 0 & L \end{bmatrix}}_{M} + \underbrace{\begin{bmatrix} \hat{N}_d & -A_d & 0 \\ A_d^T & G & A_l \\ 0 & -A_l^T & R \end{bmatrix}}_{N} \right) \underbrace{\begin{bmatrix} \hat{X}_d(s) \\ V_n(s) \\ I_L(s) \end{bmatrix}}_{X(s)} = \underbrace{\begin{bmatrix} 0 \\ A_s \\ 0 \end{bmatrix}}_{b} V_s(s) \quad (1)$$

where $(s\hat{M}_d+\hat{N}_d)\hat{X}_d(s)=A_d V_n(s)$ are the state equations of the reduced-order model of distributed lines; $V_n(s)$ and $I_L(s)$ represent the node voltage vector and R-L branch current vector; the matrices R, L, G, and C include lumped resistors, inductors, conductors, and capacitors; and $A_d$, $A_l$, and $A_s$ are incidence matrices.

Let vector $X_k = [\hat{X}_{d,k} \, V_{n,k} \, I_{L,k}]^T$ be the kth-order moment of X(s) about s=0. If $Q=[X_0 \, X_1 \, \ldots \, X_{q-1}]$ is used as the congruence transform matrix, then the MNA matrices of the reduced-order model are obtained: $\hat{M}=Q^T M Q$ and $\hat{N}=Q^T N Q$. Thus, the kth-row and the lth-column entry of $\hat{N}$ and $\hat{M}$ become $\hat{n}_{k,l}=X_{k-1}^T N X_{l-1}$ and $\hat{m}_{k,l}=X^{k-1T}M X_{l-1}$, respectively. Since the recursive moment formula implies $NX_0 = B$ $NX_{i+1} = -MX_i$, for $i=0, 1, \ldots, q$ $\hat{n}_{k,l}$ will be $$\hat{n}_{k,l} = -X_{k-1}^T M X_{l-2} \qquad (2)$$

$$= -\left(\hat{X}_{d,k-1}^T \hat{M}_d \hat{X}_{d,l-2} + V_{n,k-1}^T C V_{n,l-2} + I_{L,k-1}^T L I_{L,l-2}\right)$$

where $V_{n,k-1}{}^T C V_{n,l-2}$ and $I_{L,k-1}{}^{TLI}{}_{L,l-2}$, related to lumped circuits, can be calculated by the technique: "Crosstalk estimated in high-speed VLSI interconnect using coupled RLC-tree models", which is proposed in *Proc. 2002 IEEE Asia Pacific Conference on Circuits and Systems* by H. J. Lee, C. C. Chu, and W. S. Feng. For $\hat{X}_{d,k-1}{}^{T\hat{M}}{}_d \hat{X}_{d,l-2}$, the details will be shown as follows.

Moment Computations for Coupled RLC-Tree Interconnect Models

A set of coupled RLC trees contains several individual RLC trees with capacitive and inductive couplings to each other. Each RLC tree comprises floating resistors and self inductors from the ground and capacitors connecting between nodes on the tree and the ground. A tree with a voltage source connected to its root is called an aggressor tree; by contrast, trees whose roots are grounding are called victim trees. By ignoring self inductances and mutual inductances, the conventional coupled RC-tree models are obtained. In this invention, coupled interconnects are modeled as coupled RLC trees for analyzing the crosstalk noises.

Figure 2:
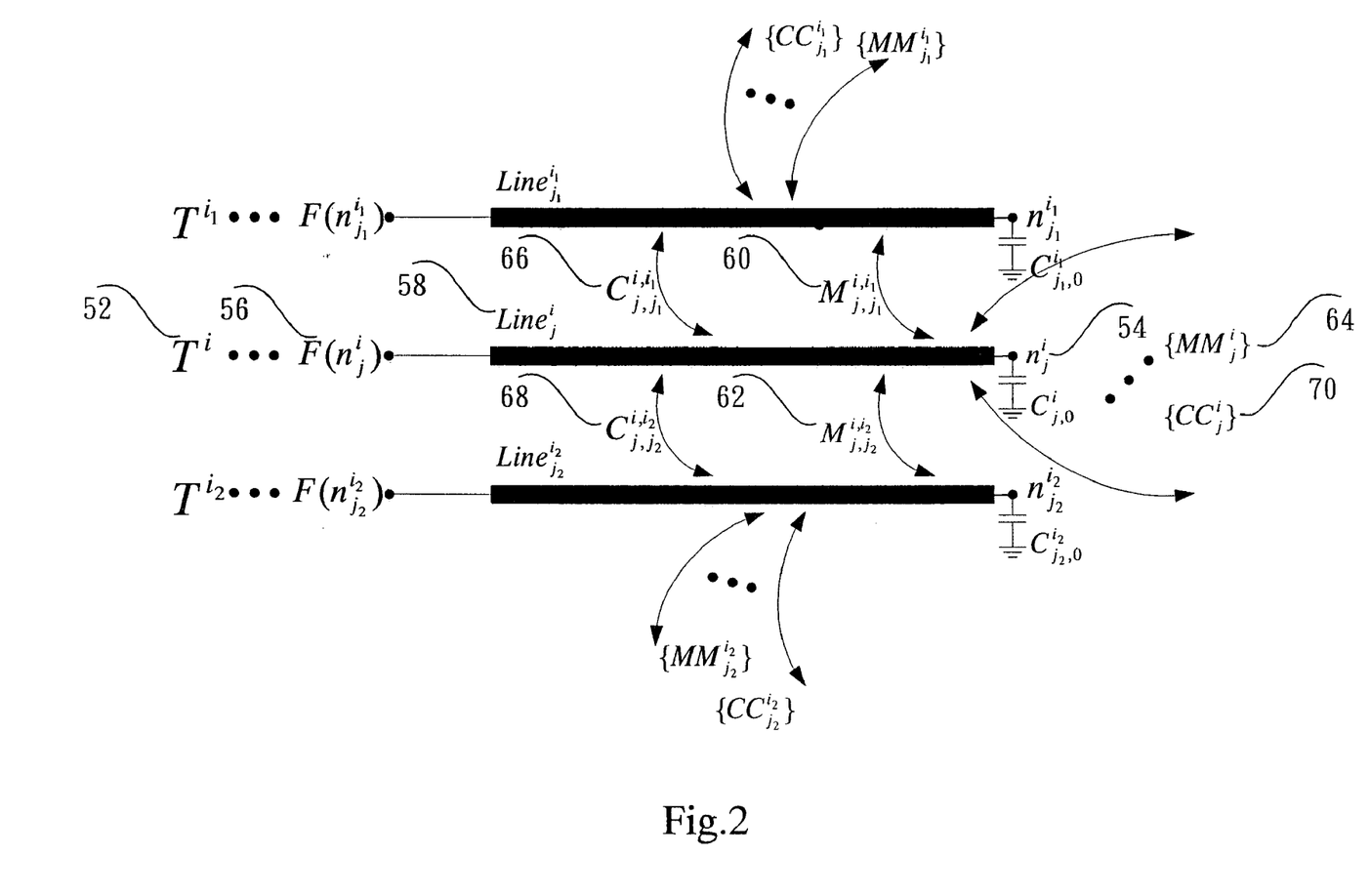
FIG. 2 is an illustration of a typical section of tree $T^i$ in coupled RLC trees.

To clearly describe the complex coupled RLC-tree structures, the invention first introduces the notation. Consider a typical section of tree $T^i$ in coupled RLC trees shown in FIG. 2, where $n_j{}^i$ is the jth node in the tree $T^i$ and $F(n_j{}^i)$ is the corresponding father node of $n_j{}^i$. Node $n_0{}^i$ is the root of $T^i$ and $F(n_0{}^i)=\phi$. $N^i$ is the set of the non-root nodes in $T^i$. $S(n_j{}^i)$ denotes the set of the son nodes of $n_j{}^i$. Each root node has only one son node. This study assumes that the conventional lumped model between node $n_j{}^i$ and its father node $F(n_j{}^i)$ on coupled RLC trees is replaced with a distributed line $Line_j{}^i$, where $n_j{}^i$ is the jth node in the tree $T^i$. As a result, the network is mixed with lumped and distributed circuits. $R_j{}^i$, $L_j{}^i$, and $C_j{}^i$ are the per-unit resistance, inductance, and capacitance of $Line_j{}^i$. $C_{j,j_1}{}^{i,i_1}$ and $M_{j,j_1}{}^{i,i_1}$ are the total coupling capacitance and mutual inductance between $Line_j{}^i$ and $Line_{j_1}{}^{i_1}$. $CC_j{}^i$ and $MM_j{}^i$ the set of total coupling capacitance and mutual inductance corresponding to $Line_j{}^i$. In general, the coupling effect, especially with inductive couplings, is not restricted to arising between two closest neighbors. Therefore, the proposed method will address the comprehensive circumstances that each set $CC_j{}^i$ and $MM_j{}^i$ may include several coupling capacitances and mutual inductances. $P_{jk}{}^i$ is defined as the common path of the path $P_j{}^i$ from $n_j{}^i$ to the root of $T^i$ and of the path $P_k{}^i$ from $n_k{}^i$ to the root of $T^i$. The set of ancestor nodes of $n_j{}^i$, defined as $A(n_j{}^i)$, covers the nodes on the path $P_{F(j)}{}^i$ from $F(n_j{}^i)$ to the root of $T^i$. Let $\hat{A}(n_j{}^i)=\{\{A(n_j{}^i)-n_0{}^i\}\cup {}^{n_j{}^i}\}$. Conversely, $D(n_j{}^i)=\{n_x{}^i | n_j{}^i \in A(n_x{}^i)\}$ denotes the set of descendant nodes of $n_j{}^i$. We also define $\hat{D}(n_j{}^i)=\{n_j{}^i \cup D(n_j{}^i)\}$.

Moment Model of Coupled RLC Lines

Figure 3:
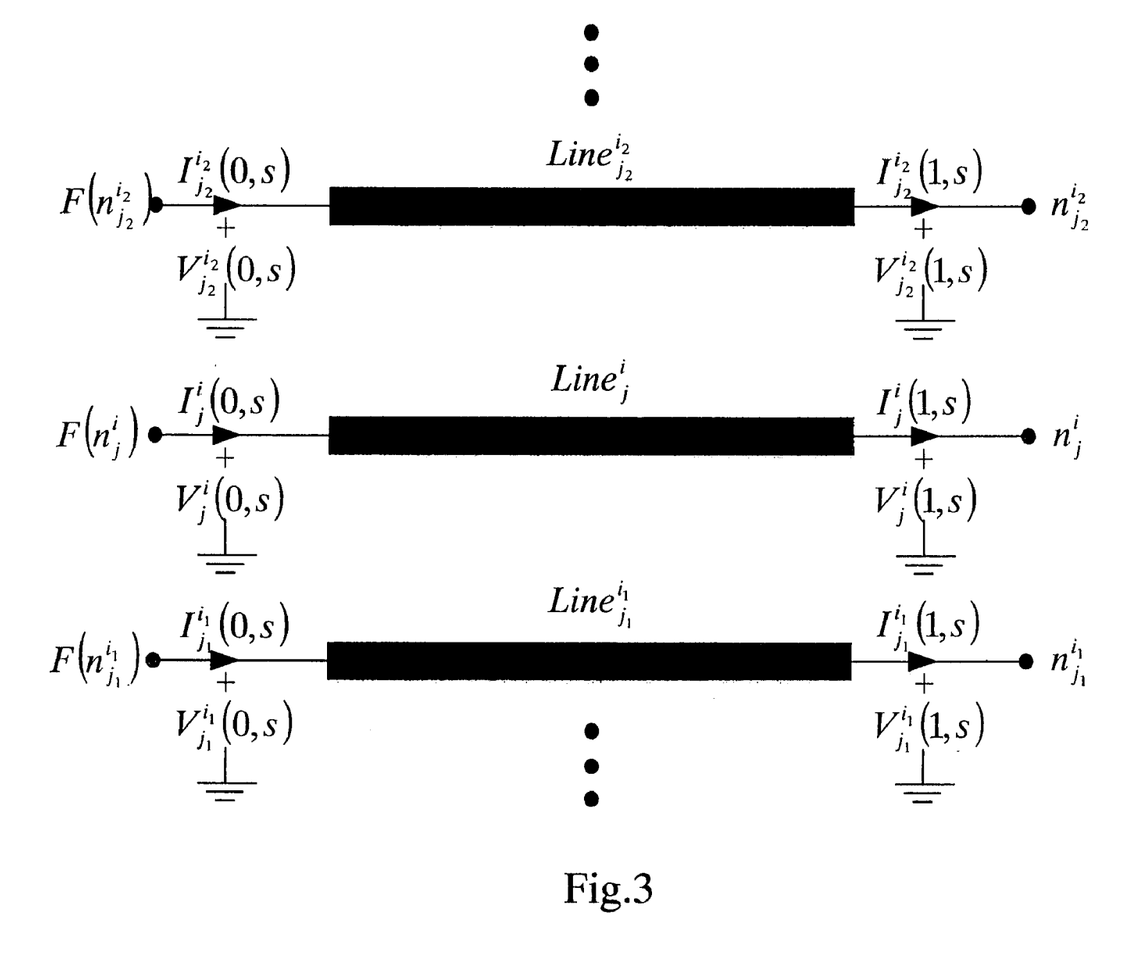
FIG. 3 represents the distributed line model in coupled RLC trees.

Let $V_j{}^i(x,s)$, $I_j{}^i(x,s)$, and $I_{C_j}{}^i(x,s)$ be the transfer functions of the voltage, current, and capacitive current at coordinate x on $Line_j{}^i$, where $x=0$ and $x=1$ correspond to the near end and the far end of the line, as shown in FIG. 3. Applying the Laplace transformation, the Telegrapher's equations of $Line^i$ can be rewritten as follows:

$$\frac{\partial V_j^i(x,s)}{\partial x} = -(R_j^i + sL_j^i)I_j^i(s) - \sum_{MM_j^i}\left(sM_{j,j_1}^{i,i_1} I_{j_1}^{i_1}(x,s)\right) \qquad (3)$$

$$\frac{\partial I_j^i(x,s)}{\partial x} = -sC_{jT}^i V_j^i(x,s) - \sum_{CC_j^i}\left(sC_{j,j_1}^{i,i_1} V_{j_1}^{i_1}(x,s)\right) \qquad (4)$$

where $C_{jT}{}^i = C_j{}^i + \Sigma CC_{j,j_1}{}^{i,j_1}$ is the sum of the grounding capacitance and the coupling ones on $Line_j{}^i$. Expanding $V_j{}^i(x,s)$, $I_j{}^i(x,s)$, and $I_{C_j}{}^i(x,s)$ in power series, we have the kth-order moments $V_{j,k}{}^i(x)$, $I_{j,k}{}^i(x)$, and $I_{C_j,k}{}^i(x)$, which are the coefficients of $s^k$, respectively. If $k=0$, each capacitor behaves as an open circuit, the zeroth-order current moment $I_{C_{j,0}}{}^i(x) = I_{j,0}{}^i(1) = 0$ and the zeroth-order voltage moment $V_{j,0}{}^i(x) = V_{j,0}{}^i(0) = V_s{}^i$. For $k>0$, the kth-order moments $$I_{C_{j,k}}^i(x) = C_{jT}^i V_{j,k-1}^i(x) - \sum_{C_{j,j_1}^{i,i_1} \in CC_j^i} C_{j,j_1}^{i,i_1} V_{j_1,k-1}^{i_1}(x) \qquad (5)$$

$$I_{j,k}^i(x) = I_{j,k}^i(1) + \int_x^1 I_{C_{j,k}}^i(z)dz \qquad (6)$$

$$V_{j,k}^i(x) = V_{j,k}^i(0) - \left(xR_j^i I_{j,k}^i(x) + \int_0^x zR_j^i I_{C_{j,k}}^i(z)dz\right) - \qquad (7)$$
$$\left(xL_j^i I_{j,k-1}^i(x) + \int_0^x zL_j^i I_{C_{j,k-1}}^i(z)dz\right) -$$
$$\sum_{M_{j,j_1}^{i,i_1} \in MM_j^i}\left(xM_{j,j_1}^{i,i_1} I_{j_1,k-1}^{i_1}(x) + \int_0^x zM_{j,j_1}^{i,i_1} I_{j_1,k-1}^{i_1}(z)dz\right),$$

where Eqs. (5) and (6) are derived from Kirchhoff's current law and Eq. (7) is derived from Kirchhoff's voltage law.

In this invention, $I_{C_j}{}^i(x)$ and $V_{j,k}{}^i(x)$ are represented as polynomials and the corresponding coefficients are calculated, that is, $$I_{C_{j,k}}^i(x) = \sum_{n=0}^{m} \alpha_{j,kn}^i x^n \quad V_{j,k}^i(x) = \sum_{n=0}^{p} \beta_{j,kn}^i x^n \qquad (8)$$

If $k=0$, zeroth-order polynomial $I_{C_{j,0}}{}^i(x)=0$ and $V^{j,0,i}(x)=V_s{}^i$ imply that $\alpha_{j,00}{}^i=0$ and $\beta_{j,00}{}^i=V_s{}^i$. For $k>0$, substituting Eq. (8) into Eq. (5) gives $$\alpha_{j,kn}^i = C_{jT}^i \beta_{j,(k-1)n}^i - \sum_{C_{j,j_1}^{i,i_1} \in CC_j^i} C_{j,j_1}^{i,i_1} \beta_{j_1,(k-1)n}^{j_1} \qquad (9)$$

Integrating $I_{C_{j,k}}(z)dz$ from $z=x$ to $z=1$ and $zI_{C_{j,k}}(z)dz$ from $z=0$ to $z=x$, we have $$\int_x^1 I_{C_{j,k}}(z)dz = \sum_{n=0}^m \frac{\alpha^i_{j,kn}}{n+1}(1-x^{n+1})$$

$$\int_0^x zI_{C_{j,k}}(z)dz = \sum_{n=0}^m \frac{\alpha^i_{j,kn}}{n+2}x^{n+2}$$

Substituting Eq. (10) into Eq. (7) concludes that $$\beta^i_{j,k0} = V^i_{j,k}(0) \quad (11)$$

$$\beta^i_{j,k1} = -R^i_j\left(I^i_{j,k}(1) + \sum_{n=0}^m \frac{\alpha^i_{j,kn}}{n+1}\right) -$$

$$L^i_j\left(I^i_{j,k-1}(1) + \sum_{n=0}^m \frac{\alpha^i_{j,(k-1)n}}{n+1}\right) - \sum_{M^{i,i_1}_{j,j_1} \in MM^i_j}\left(I^{i_1}_{j_1,k-1}(1) + \sum_{n=0}^m \frac{\alpha^{i_1}_{j_1,(k-1)n}}{n+1}\right)$$

$$\beta^i_{j,k(n+2)} = \frac{1}{(n+1)(n+2)}\left(R^i_j\alpha^j_{j,kn} + L^i_j\alpha^j_{j,(k-1)n} + \sum_{M^{i,i_1}_{j,j_1} \in MM^i_j} M^{i,i_1}_{j,j_1}\alpha^{i_1}_{j_1,(k-1)n}\right), n \geq 0$$

The relations between the order of polynomials m and p and the order of moments k can be found from Eqs. (9) and (11). First, m=0 when k=1. Second, from the third part of Eq. (11), we have p=m+2. Finally, from Eq. (9), the order of polynomial $I_{C_{j,k}}(x)$ is equal to p(=m+2). As a result, by induction, m=2(k−1) and p=2k are derived for coupled RLC trees with distributed lines. Notably, all these coefficients can be generated recursively.

After the coefficients αs and βs are computed, the moment model of coupled RLC lines can be established. From Eq. (6), setting x=0, we obtain $$I^i_{j,k}(0) = I^i_{j,k}(1) + J^i_{j,k} \quad (12)$$

where $$J^i_{j,k} = \int_0^1 I_{C_{j,k}}(z)dz = \sum_{n=0}^{2(k-1)} \frac{\alpha^j_{j,kn}}{n+1} \quad (13)$$

representing the summation of the capacitive currents of $Line^i_j$. Moreover, Eq. (7) can be rewritten $$V^{j,ki}(1) = V^i_{j,k}(0) - R^i_j I^{j,ki}(1) - E^i_{LM_{j,k}} - E^i_{j,k} \quad (14)$$

where $$E^i_{LM_{j,k}} = L^i_j I^{i_1}_{j,k-1}(1) + \sum_{M^{i,i_1}_{j,j_1} \in MM^i_j} M^{i,i_1}_{j,j_1} I^{i_1}_{j_1,k-1}(1) \quad (15)$$

and $$E^i_{j,k} = R^i_j\int_0^1 zI_{C_{j,k}}(z)dz + L^i_j\int_0^1 zI_{C_{j,k-1}}(z)dz + \sum_{M^{i,i_1}_{j,j_1} \in MM^i_j} M^{i,i_1}_{j,j_1}\int_0^1 zI_{C_{j,k-1}}(z)dz = R^i_j\sum_{n=0}^{2(k-1)} \frac{\alpha^j_{j,kn}}{n+2} + \quad (16)$$

-continued $$L^i_j\sum_{n=0}^{2(k-2)} \frac{\alpha^j_{j,(k-1)n}}{n+2} + \sum_{M^{i,i_1}_{j,j_1} \in MM^i_j} M^{i,i_1}_{j,j_1}\sum_{n=0}^{2(k-2)} \frac{\alpha^{i_1}_{j_1,(k-1)n}}{n+2}$$

Figure 4:
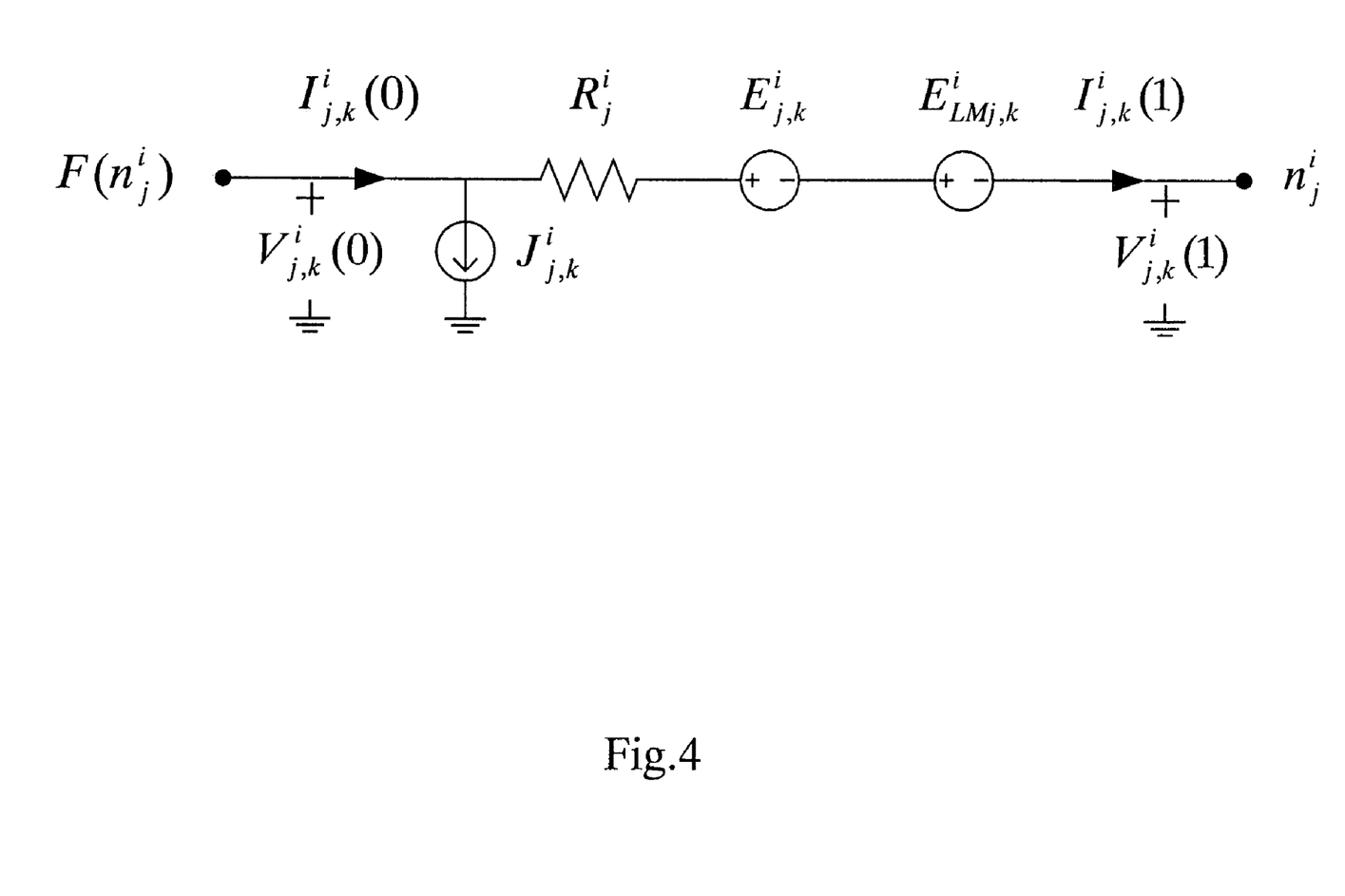
FIG. 4 represents the moment model of couple RLC lines.

$E^i_{j,k}$ and $E^i_{LM_{j,k}}$ represent the voltage drops from voltage moment $V^i_{j,k}(0)$, resulted from the kth-order and the (k−1)st-order capacitive current moment flowing through resistance and inductance of $Line^i_j$, respectively. For coupled RC lines, $E^i_{LM_{j,k}}=0$. The moment model of coupled RLC lines is depicted in FIG. 4.

Inserting Coupled Lines into Coupled RLC Trees

This invention uses a function, $Line(n^i_j)$, to indicate a line connected between nodes $n^i_j$ and $F(n^i_j)$, $Line(n^i_j)=1$, or not, $Line(n^i_j)=0$. Thus the kth-order current moment $I^{j,ki}(1)$ at x=1 can be obtained as below:

$$I^i_{j,k}(1) = I^i_{C_{j,k}} + \sum_{n^i_x \in D(S(n^i_j))} \left(I^i_{C_{x,k}} + Line(n^i_x) \cdot J^i_{x,k}\right) \quad (17)$$

Next, the voltage moment $V^i_{j,k}$ is also considered. First, the added current source induces further voltage drops through resistances and inductances at all nodes $A(n^i_j)$, the set of ancestor nodes of $n^i_j$. Second, the voltage source $E^i_{j,k}$ cause voltage drops only between $V_{j,k}{}^i$ and $V_{D(j),k}{}^i$. Thus $V^{j,ki}$ can be obtained as follows:

$$V_{j,k}^i = -\sum_{n_p^i \in A(n_j^i)} \left( R_p^i I_{p,k}^i(1) + L_p^i I_{p,k-1}^i(1) + \sum_{M_{p,p_1}^{i,i_1} \in MM_p^i} M_{p,p_1}^{i,i_1} I_{p_1,k-1}^{i_1}(1) + \text{Line}(n_p^i) \cdot E_{j,k}^i \right) \quad (18)$$

Finally, the recursive moment computation formulae can be obtained by incorporating the moment model of coupled distributed lines. From Eq. (17), the recursive relationship of the kth-order current moments is given as $$I_{j,k}^i(1) = I_{C_{j,k}}^i + \sum_{n_y^i \in S(n_j^i)} I_{y,k}^i(0) \quad (19)$$

where $$I_{y,k}^i(0) = I_{y,k}^i(1) + \text{Line}(n_y^i) \cdot J_{y,k}^i \quad (20)$$

Each current moment can be calculated from the leaves to the root of tree $T^i$. Considering the relationships between voltage moments $V^{j,ki}$ and $V_{F(j),k}{}^i$, Eq. (18) can be rewritten $$V_{j,k}^i = V_{F(j),k}^i - R_j^i I_{j,k}^i(1) - L_j^i I_{j,k-1}^i(1) - \sum_{M_{j,j_1}^{i,i_1} \in MM_j^i} M_{j,j_1}^{i,i_1} I_{j_1,k-1}^{i_1}(1) - \text{Line}(n_j^i) \cdot E_{j,k}^i \quad (21)$$

The computational complexity of the proposed recursive formulas of distributed models is $O(nk^2)$, where n is the number of nodes in the tree. On the other hand, that of lumped models equals $O(mk)$, where m is the number of nodes in the tree. In general, $m$ must be larger than nk so that the lumped model can be enough accurate.

Using the Moment Information to Construct Crosstalk Noise Estimation Model

For $\hat{X}_{d,k-1}^{T\hat{M}} \hat{X}_{d,l-2}$ in Eq. (2), Proposition 1 shows the results.

Proposition 1: The term $\hat{X}_{d,k-1} \hat{M}_d \hat{X}_{d,l-2}$ can be calculated by evaluating the contribution of each distributed line. The contributions of a line $\text{Line}_j^i$ are $$\int_0^j V_{j,k-1}^i(z) I_{C_{j,k-1}}^i(z) dz = \sum_{n=0}^{2(k+l-3)} \frac{a_{j,n}^i}{n+1} \quad (22)$$

where $a_{j,n}^i = \sum_{p=max(0,n-2(l-2(l-2)))}^{min\ (2(k-1),n)} \beta_{j,k-1,p}^i \alpha_{j,l-1,n-p}^i$ and $$\int_0^j I_{j,k-1}^i(z) E_{LM_{j,l-2}}^i(z) dz = \sum_{n=0}^{2(k+l-4)} \frac{b_{j,n}^i}{n+1} \quad (23)$$

where $b_{j,n}^i$ is the coefficient of the term $z^n$ in the polynomial $I_{j,k-1}^i(z) E^{LM}{}_{j,l-2}(z)$ which can be calculated by polynomial multiplication of $$I_{j,k-1}^i(1) + \sum_{n=0}^{2(k-2)} \frac{1}{n+1} \alpha_{j,k-1,n}^i (1 - x^{n+1})$$

and $$L_j^i \left[ I_{j,k-1}^i(1) + \sum_{n=0}^{2(l-3)} \frac{1}{n+1} \alpha_{j,k-1,n}^i (1-x^{n+1}) \right] + \sum_{M_{j,j_1}^{i,i_1} \in MM_j^i} M_{j,j_1}^{i,i_1} \left[ I_{j_1,k-1}^{i_1}(1) + \sum_{n=0}^{2(l-3)} \alpha_{j_1,k-1,n}^{i_1}(1-x^{n+1}) \right]$$

Moreover, subtle relationships between entries of $\hat{M}$ and $\hat{N}$ and simplification of $\hat{N}$ are summarized in Proposition 2.

Proposition 2: Let matrices $\hat{M}$ and $\hat{N}$ be the MNA matrices for the reduced-order model that are generated by the congruence transformation Q, where $Q = \lfloor X_0\ X_1\ \ldots\ X_{q-1} \rfloor$. Thus entries of $\hat{M}$ and $\hat{N}$ have the following subtle relationships:

1. $\hat{m}_{ij} = -X^{i-1T} N X_j = -\hat{n}_{i,j+1}$
2. $m_{ij} = X_{j-1}^T M X_{i-1} = -X_{j-1}^T N X_i = -\hat{n}_{j,i+1}$ The entries in the first column and the first row of matrices $\hat{N}$ have the relationships shown as below:

1. $\hat{n}_{11} = 0$;
2. $\hat{n}_{i1}$ (i>1), denoted as $I_{1j-1}^a$ is equal to the (i−1)st-order moment of the current entering node $n_1^a$ in the aggressor tree $T^a$;
3. $\hat{n}_{1i} = -\hat{n}_{i1}$ Crosstalk Noise Estimation Model Let V(s) and $\hat{V}$(s) be the step responses of the original model and the desired reduced-order model, respectively. Technique disclosed in M. Kuhlmann and S. S. Sapatnekar, "Exact and efficient crosstalk estimation," *IEEE Trans. Computer-Aided Design*, vol. 20, no. 7, pp. 858–866, 2001, suggested an appropriate formula of the q-pole reduced-order model $\hat{V}$(s) as follows (as in step 24):

$$\hat{V}(s) = \frac{a_0 + a_1 s + \cdots + a_{q-2} s^{q-1}}{1 + b_1 s + \cdots + b_{q-1} s^{q-1} + b_q s^q} \quad (24)$$

which causes the approximate crosstalk voltage $\hat{v}(t)$ to be zero for t converging to 0 and ∞. Conventional moment matching techniques are often used to solve the unknown coefficients $a_i(0 \leq i \leq q-2)$ and $b_j(1 \leq j \leq q)$ by using the front $2q-1$ moments $\{V_1, V_2, \ldots, V_{2q-1}\}$ of the original model:

$$V(s) = V_1 + V_2 s + V_3 s^2 + \ldots + V_{2q-1} s^{2q-2} + \ldots$$

In step 26, Eq. (24) can also be rewritten as the pole-residue form $$\hat{V}(s) = \frac{k_1}{s-p_1} + \frac{k_2}{s-p_2} + \cdots + \frac{k_q}{s-p_q} \quad (25)$$

where $p_i$ for $i = 1, 2, \ldots, q$ are poles of $\hat{V}(s)$ and each $k_i$ is the residue corresponding to the pole $p_i$. By applying the inverse Laplace transformation, we have $$\hat{v}(t) = k_1 e^{p_1 t} + k_2 e^{p_2 t} + \ldots + k_q e^{p_q t}$$

In step 28, the peak value of the crosstalk waveform will occur at time $t = t_m$ where $\hat{v}'(t_m) = 0$ and $\hat{v}''(t_m) < 0$.

In the previous moment computations, the input waveform is assumed to be a step function. However, the input signal in step 10 may be with an arbitrary waveform. Let the updated $V(s)$ be $$V(s) = m_1' s + m_2' s^2 + m_3' s^3 + m_4' s^4 m_5' s^5 \quad (26)$$

For example, suppose that the input signal is a ramp function as follows:

$$v(t) = \frac{t}{\tau} u(t) - \frac{t}{\tau} u(t-\tau) + u(t-\tau)$$

where $u(t)$ is a step function and $1/\pi$ the slope of the ramp function. Applying the Laplace transform, we have $$V(s) = \frac{1}{s}\left(1 - \frac{\tau}{2}s + \frac{\tau^2}{6}s^2 - \frac{\tau^3}{24}s^3 + \frac{\tau^4}{120}s^4 + \cdots\right) \quad (27)$$

Comparing the coefficients of Eqs. (26) and (27) concludes $$m_1' = m_1$$

$$m_2' = m_2 - \frac{\tau}{2} m_1$$

$$m_3' = m_3 - \frac{\tau}{2} m_2 + \frac{\tau^2}{6} m_1$$

$$m_4' = m_4 - \frac{\tau}{2} m_3 + \frac{\tau^2}{6} m_2 - \frac{\tau^3}{24} m_1$$

$$m_5' = m_5 - \frac{\tau}{2} m_4 + \frac{\tau^2}{6} m_3 - \frac{\tau^3}{24} m_2 + \frac{\tau^4}{120} m_1$$

$$\vdots$$

Illustrative Examples

Figure 5:
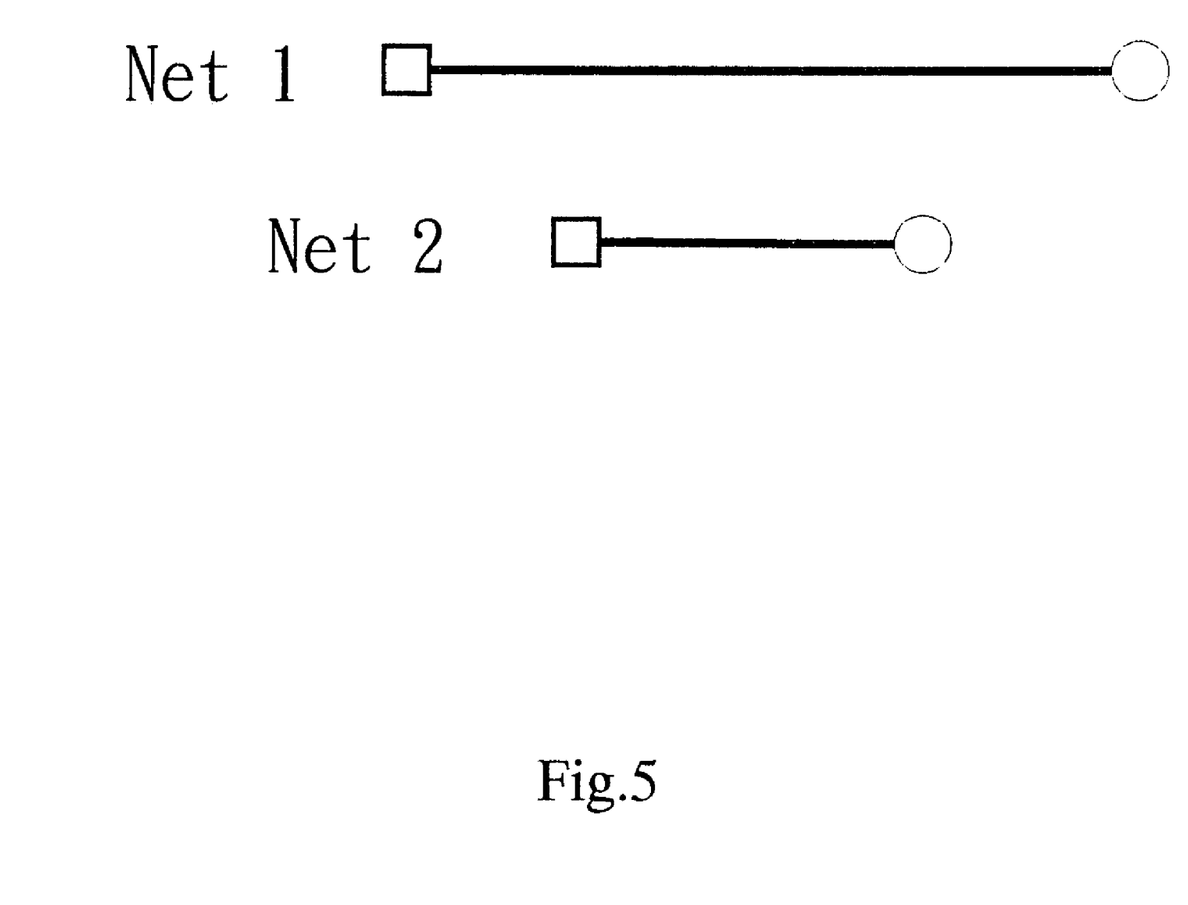
FIG. 5 illustrates three types of coupled RLC trees: (a) two lines (b) tree 1 (c) tree 2. The lengths of the coupling lines of net 1 belong to the set L1={1,2,3,4,5} (mm) and those of net 2 are also in the set L2={1,2,3,4,5} (mm); the latter are never longer than the former.

To verify the accuracy of the proposed method, a coupling circuit but not limiting examples shown in FIG. 5 are studied for crosstalk estimations. The squares represent the roots of the trees and the circles stand for the leaves of the trees for crosstalk estimations. Among all circuits, the line parameters are resistance: 35 Ω/cm, grounding capacitance: 5.16 pF/cm, self inductance: 3.47 nH/cm, coupling capacitance: 6 pF/cm, and mutual inductance: 1 nH/cm. The wire resistance, capacitance and inductance are distributed per 100 μm. The loading of each line is 50 fF. We examine peak values of noises and peak noise occurring time for the cases with different circuit topologies, line lengths, coupling locations, effective driver impedances, and rising times. For the circuits in FIG. 5, the lengths of the coupling line of net 1 belong to the set L1={1,2,3,4,5}(mm) and those of net 2 are also in the set L2={1,2,3,4,5}(mm) that are never longer than the lengths of net 1. Each net 2 changes the coupling locations and shifts 1 mm each time from alignment at the near end of net 1 to that at the far end of net 1. In each case, net 1 and net 2 are excited independently. In addition, four effective driver impedance pairs: 3 Ω—3 Ω, 3 Ω-30 Ω, 30 Ω-3 Ω and 30 Ω—30 Ω, which are connected to the near ends of the two nets, are examined. The voltage source connected to the aggressor net is a ramp function with two rising time 0.02 ns and 0.2 ns and with a normalized unit magnitude. Thus, we have total 560 cases to examine accuracy of the proposed method.

The conventional one-pole model (1P) and two-pole model (2P) and our new method with three-pole model (S3P), . . . , six-pole model (S6P) are investigated for comparison studies. Absolute and relative errors of crosstalk peak values in comparison with HSPICE simulation results are summarized in Tables 1 Among the 560 cases, model 1P has unstable poles in 48 cases and model 2P is unstable in 98 cases. Table 2 summarizes the computational times of moments and the relative errors of model S6P generated by lumped couple RLC-tree models with different number of sections per 1 mm long, to compare the efficiency and the accuracy between distributed lines and lumped ones. From simulation results, we have the following observations:

1. The models generated by the proposed method outperform the conventional 1P and 2P models. Thus these conventional models are no longer appropriate for coupled RLC trees. Increasing the order of the reduced-order models allows the proposed models perform more accurately.

2. From the viewpoints of the absolute errors in Table 1, model S3P, whose average errors are smaller than 10%, seems acceptable for estimating crosstalk noise. However, the relative errors imply that model S3P seems not accurate as expected. Model S6P is recommended to balance computational efficiency and estimation performance.

3. The computational time of moments and the relative errors of Model S6P yielded by the proposed method are 8.27 seconds and 5.15%, respectively. Table 2 displays that it must cost more than 271.96 seconds to obtain the same relative error by using lumped coupled RLC lines. Obviously, the efficiency and the accuracy of distributed models outperform those of lumped models.

What is claimed is:

1. A method and verification of estimating crosstalk noise in coupled RLC interconnects with distributed line in nanometer integrated circuits, wherein the moment model of a distributed line $Line_j^i$ comprising a series of formulas as follows:

$$I_{j,k}^i(0) = I_{j,k}^i(1) + J_{j,k}^i$$

$$V_{j,k}^i(1) = V_{j,k}^i(0) - R_j^i(1) - E_{LM_{j,k}}^i - E_{j,k}^i$$

where $$J^i_{j,k} = \sum_{n=0}^{2(k-1)} \frac{\alpha^i_{j,k,n}}{n+1}$$

$$E^i_{LM_{j,k}} = L^i_j I^i_{j,k-1}(1) + \sum_{M^{i,i_1}_{j,j_1} \in MM^i_j} M^{i,i_1}_{j,j_1} I^{i_1}_{j_1,k-1}(1)$$

$$E^i_{j,k} = R^i_j \sum_{n=0}^{2(k-1)} \frac{\alpha^i_{j,k,n}}{n+2} + L^i_j \sum_{n=0}^{2(k-2)} \frac{\alpha^i_{j,(k-1)n}}{n+2} +$$

$$\sum_{M^{i,i_1}_{j,j_1} \in MM^i_j} M^{i,i_1}_{j,j_1} \sum_{n=0}^{2(k-2)} \frac{\alpha^{i_1}_{j_1,(k-1)n}}{n+2}$$

and where $$\alpha^i_{j,k,n} = C^i_{jT} \beta^i_{j,(k-1)n} - \sum_{C^{i,i_1}_{j,j_1} \in CC^i_j} C^{i,i_1}_{j,j_1} \beta^{i_1}_{j_1,(k-1)n}$$

$$\beta^i_{j,k,0} = V^i_{j,k}(0)$$

$$\beta^i_{j,k,1} = -R^i_j \left( I^i_{j,k}(1) + \sum_{n=0}^{m} \frac{\alpha^i_{j,k,n}}{n+1} \right) -$$

$$L^i_j \left( I^i_{j,k-1}(1) + \sum_{n=0}^{m} \frac{\alpha^i_{j,(k-1)n}}{n+1} \right) -$$

$$\sum_{M^{i,i_1}_{j,j_1} \in MM^i_j} \left( I^{i_1}_{j_1,k-1}(1) + \sum_{n=0}^{m} \frac{\alpha^{i_1}_{j_1,(k-1)n}}{n+1} \right)$$

$$\beta^i_{j,k(n+2)} = \frac{1}{(n+1)(n+2)} (R^i_j \alpha^i_{j,k,n} + L^i_j \alpha^i_{j,(k-1)n} +$$

$$\sum_{M^{i,i_1}_{j,j_1} \in MM^i_j} M^{i,i_1}_{j,j_1} \alpha^{i_1}_{j_1,(k-1)n}), n \geq 0$$

and where
  a. i represents tree $T^i$;
  b. $n^i_j$ is the jth node in the tree $T^i$, which is the far end of the line $Line^i_j$ (x=1);
  c. $F(n^i_j)$ is the corresponding father node of $n^i_j$, which is the near end of the line $Line^i_j$ (x=0);
  d. $R^i_j$, $L^i_j$, and $C^i_j$ are the per-unit resistance, inductance, and capacitance of $Line^i_j$;
  e. $M^{i,j_1}_{j,j_1}$ are the total coupling capacitance and mutual inductance between $Line^i_j$ and $Line^{i_1}_{j_1}$;
  f. $C^i_{jT} = C^i_j + \Sigma CC^i_j$ $C^{j,j}_1{}^{i,i_1}$, is the sum of the grounding capacitance and the coupling ones on $Line^i_j$;
  g. $CC^i_j$ and $MM^i_j$ the set of total coupling capacitance and mutual inductance corresponding to $Line^i_j$;
  h. $V^i_j(x,s)$, $I^i_j(x,s)$, and $I_{C_j}{}^i(x,s)$ be the transfer functions of the voltage, current, and capacitive current at coordinate x on $Line^i_j$;
  i. $V^i_{j,k}(x)$, $I^i_{j,k}(x)$, and $I_{C_{j,k}}{}^i(x)$ are the kth-order moments of $V^i_j(x,s)$, $I^i_j(x,s)$, and $I_{C_j}{}^i(x,s)$;
  j. $\alpha^i_{j,k,n}$ is the nth-order coefficient of the Taylor series of $I_{C_{j,k}}{}^i(x)$, that is, $$I^i_{C_{j,k}}(x) = \sum_{n=0}^{m} \alpha^i_{j,k,n} x^n;$$

and
  k. $\beta^i_{j,k,n}$ is the nth-order coefficient of the Taylor series of $V^i_{j,k}(x)$, that is, $$V^i_{j,k}(x) = \sum_{n=0}^{p} \beta^i_{j,k,n} x^n.$$

2. The method and verification of estimating crosstalk noise in coupled RLC interconnects with distributed line in nanometer integrated circuits as claimed in claim 1, wherein the contributions of the line $Line^i_j$ to the value of the kth-row and the lth-column entry of $\hat{N}$ are given as follows:

$$\int_0^1 V^i_{j,k-1}(z) I^i_{C_{j,l-1}}(z) dz = \sum_{n=0}^{2(k+l-3)} \frac{a^i_{j,n}}{n+1}$$

$$\int_0^1 I^i_{j,k-1}(z) E^i_{LM_{j,l-2}}(z) dz = \sum_{n=0}^{2(k+l-4)} \frac{b^i_{j,n}}{n+1}$$

where $a^i_{j,n} = \Sigma_{p=max(0,n-2(l-2))}^{min(2(k-1),n)} \beta^i_{j,k-1,p} \alpha^i_{j,l-1,n-p}$ and $b^i_{j,n}$ is the coefficient of the term $z^n$ in the polynomial $I^i_{j,k-1}(z) E_{LM_{j,l-2}}{}^i(z)$.

* * * * *